(12) United States Patent
Oh et al.

(10) Patent No.: US 6,376,865 B1
(45) Date of Patent: Apr. 23, 2002

(54) LIGHT EMITTING DIODE AND METHOD OF FABRICATING THEREOF

(75) Inventors: Myeong Seok Oh; Sung Wook Lim; Jeong Hwan Ahn, all of Suwon-si (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 09/436,137

(22) Filed: Nov. 9, 1999

(30) Foreign Application Priority Data

Dec. 2, 1998 (KR) .............................. 98-52506

(51) Int. Cl.[7] ................... H01L 29/78; H01L 33/00
(52) U.S. Cl. .................. 257/103; 257/192; 257/191
(58) Field of Search ............................. 257/103, 192, 257/191

(56) References Cited

U.S. PATENT DOCUMENTS

| 5,008,718 | A | | 4/1991 | Fletcher et al. |
|---|---|---|---|---|
| 5,359,209 | A | * | 10/1994 | Huang |
| 5,726,465 | A | * | 3/1998 | Gerner et al. |
| 5,917,201 | A | * | 6/1999 | Ming-jiunn et al. |
| 6,107,648 | A | * | 8/2000 | Shakuda et al. |

FOREIGN PATENT DOCUMENTS

| EP | 712169 A1 | * | 5/1996 |
|---|---|---|---|
| JP | 10-256667 | | 9/1998 |

* cited by examiner

*Primary Examiner*—Stephen D. Meier
(74) *Attorney, Agent, or Firm*—Renner, Otto, Boisselle & Sklar LLP

(57) ABSTRACT

The light emitting diode includes an intermediate layer made of non-single crystalline material between single crystalline layers. By the intermediate layer, the boundary characteristic between the single crystalline layers may be improved and the defect caused by the lattice mismatch can be decreased, so that the brightness and forward voltage characteristics can be improved.

23 Claims, 2 Drawing Sheets

LIGHT EMITTING DIODE AND METHOD OF FABRICATING THEREOF

BACKGROUND OF THE INVENTION

The present invention relates to a light emitting diode, and more particular to the light emitting diode and a method of fabrication thereof in which an intermediate layer is disposed between a confining layer and a window layer to improve the boundary characteristic therebetween, so that the defect of the high density caused by lattice mismatch between the confining layer and the window layer can be decreased.

AlGaInP is the chemical compound of III-V group materails and the direct-transition material having the wide energy band. This materials is used for the light emitting diode having the frequency band of approximately 560–680 nm. In AlGaInP, the frequency is dependent upon the ratios of the Ga and Al, and generally the frequency become short as the ratio of Al is increased.

The AlGaInP light emitting diode used in the various display devices is shown in FIG. 1. As shown in FIG. 1, the typical AlGaInP light emitting device is fabricated by growing the a plurality of the epitaxial layers on a n-GaAs semiconductor substrate. First, the n-AlGaInP is epixatially grown on the semiconductor substrate 1 to form a first confining layer 3a. On the first confining layer 3a, the $(Al_xGa_{1-x})_{0.5}In_{0.5}P$ is epitaxially grown to form an activation layer 5 which generates the light having the desired frequency. A second confining layer 3b of p-type is disposed on the activation layer 5 by growing the p-AlGaInP epitaxially. On the rear side of the LED, i.e., the rear surface of the semiconductor substrate 1, a first electrode 7a including a conductive metal, which is called a rear side electrode, is formed. Further, a second electrode 7b, front side electrode, is formed in a part of the front surface of the LED, the light emitting area.

In this LED, the current applied from the second electrode 7b should be dispersed in the edge direction of the LED chip and flowing uniformly through the p-n conjunction area of the n-type confining layer 3a and the p-type confining layer 3b. AlGaInP layer used as the uppermost layer of the LED such as the p-type confining layer has the high resistance because of the low hole mobility caused by the limitation of the p-dopant level. In AlGaInP layer, thus, the current tends to flow locally into the lower portion of the second electrode 7b, not dispersed in the edge direction sufficiently. This called 'current crowding phenomenon'. By the current crowding phenomenon, the most of light that is emitting in the outside of the LED is generated under the opaque second electrode 7b. As a result, the light to be emitted in the outside of the LED is blocked by the opaque electrode 7b, so that the emitting efficiency is deteriorated.

In order to overcome the light-blocking problem, some method have been introduced. One method of these is to form the front electrode of the grid shape in the entire front area of the LED. Since the current is applied from the electrode covering the entire area of the LED, it is uniformly flowing through the entire p-n junction. In this LED, however, the opaque electrode is also blocking the light, so that the light emitting efficiency may be decreased.

Other method is to use the transparent electrode as the front electrode of the LED. The transparent electrode includes oxidation layer such as Indium Tin Oxide(ITO). However, since the ITO has the high resistance, the resistance of the LED may be increased.

Another method is disclosed in U.S. Pat. No. 5,008,718. In this patent, the window layer including the low resistance characteristic such as AlGaAs, GaAsP, and GaP is deposited on the confining layer. Since the bandgaps of these layers are larger than that of the AlGaInP light emitting leyer, the light emitted from the emitting layer is transparent therethrough. This method is described in FIG. 2.

The LED shown in FIG. 2 has the identical structure with the LED shown in FIG. 1 except the window layer 59. Since the materials such as AlGaAs, GaAsP, and GaP have the high electron mobility(i.e., low resistance), the current applied from the electrodes 7a, 7b is easily flowing into the edge region. Therefor, the current crowding phenomenon is prevented and the efficiency of the device can be improved.

In this method, however, lattice mismatch phenomenon is generated at the boundary, because the lattice constant of the GaP window layer 9 is different from that of the AlGaInP confining layer. By the lattice mismatch, the strain is generated between the confining layer 3 and the window layer 9 and the defect is increased in the window layer 9. Accordingly, the reliability and the optical characteristic of the device is deteriorated. Further, when the window layer 9 is made of the materials including AlGaAs and AlGaInP, the ratio of Al should be increased to transmit the light through the window layer 9 although the lattice is matched between the layers. Thus, the resistance of the window layer 9 may be increased and light having wavelength lower than 600 nm cannot be transparent effectively.

In order to solve the defect increasing problem, double window layers is introduced in U.S. Pat. No. 5,359,209. In this method, it is very difficult to remove perfectly the lattice mismatch phenomenon, so that the forward voltage Vf is insufficiently decreased because of the defect at the boundary. In addition, when the material such as GaAs is used as the window layer, it's bandgap is smaller than that of the AlGaInP, so that the window layer is operated as a light absorption layer and as a result the brightness of the device may be decreased.

SUMMARY OF THE INVENTION

It is an object of the present invention to provide a light emitting diode and a method of fabricating thereof in which the light emitting diode includes an intermediate layer made of non-single crystalline material between a confining layer and window having single crystalline layer to decrease the defect caused by the lattice mismatch and improve the brightness and forward voltage characteristics.

In order to achieve the object, the light emitting diode according to the present invention includes a semiconductor substrate, a first confining layer made of n-AlGaInP on the semiconductor substrate, an activation layer made of AlGaInP on the first confining layer, a second confining layer made of p-AlGaInP on the activation layer, a window layer including an intermediate layer made of non-single crystalline material on activation layer, the window layer being made of single crystalline material having the larger bandgap and lowr resistance than the activation layer, the intermediate layer being disposed at the boundary of the activation layer to improve the boundary characteristic so that the defect generated at the boundary is decreased, and first and second electrodes disposed respectively on the semiconductor substrate and the window layer.

The window layer includes material selected from the group consisting of p-Gap, GaAsP, and GaxIn1-x, where $0.7 \leq x \leq 1$. The intermediate layer in the window layer is formed in the thickness of approximately 0.01–0.5 $\mu$m and the window layer is formed in approximately 5–15 $\mu$m.

Further, the method of fabricating the light emitting diode according to the present invention comprises the steps of providing a semiconductor layer, forming activation p-n junction layer made of AlGaInP on the semiconductor layer, the p-n junction layer for emitting the light, forming the intermediate layer on the p-n junction layer to decrease the lattice mismatch between the single crystalline material, the intermediate layer being made of non-single crystalline material, forming the window layer on the intermediate layer, the window layer including the material having the larger bandgap and the lower resistance than the p-n junction layer, and forming respectively the first and second electrodes on the semiconductor layer and the window layer.

All the layers may be deposited with the MOCVD process. The intermediate layer and the window layer are deposited with same process. First, the material selected from the group consisting of p-GaP, GaAsP, and $Ga_xIn_{1-x}P$ is deposited at the first temperature of 400–700° C. Thereafter, these materials are deposited at the same condition thereon during rising the temperature to the second temperature higher than the first temperature.

DETAILED DESCRIPTION OF THE INVENTION

Figure 1:
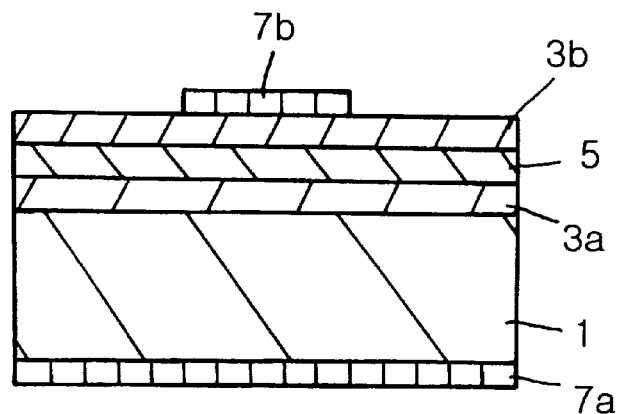
FIG. 1 is a view showing the structure of the convention light emitting diode.
Figure 2:
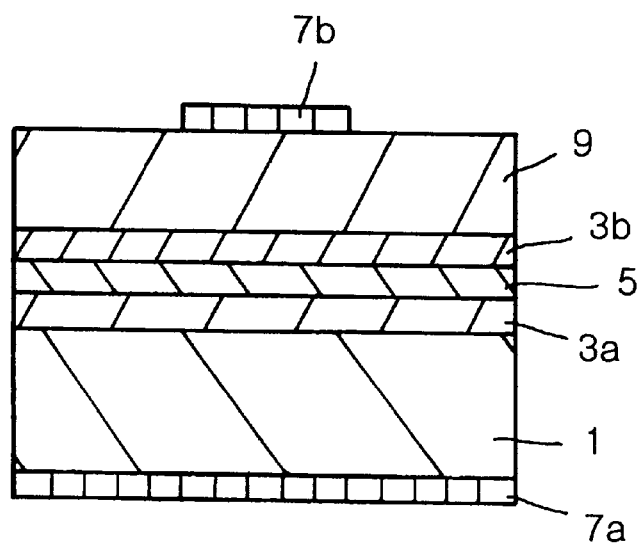
FIG. 2 is a view showing the structure of the other convention light emitting diode.

Hereinafter, the light emitting diode according to the present invention will be described in detail accompanying with the drawing.

Figure 3:
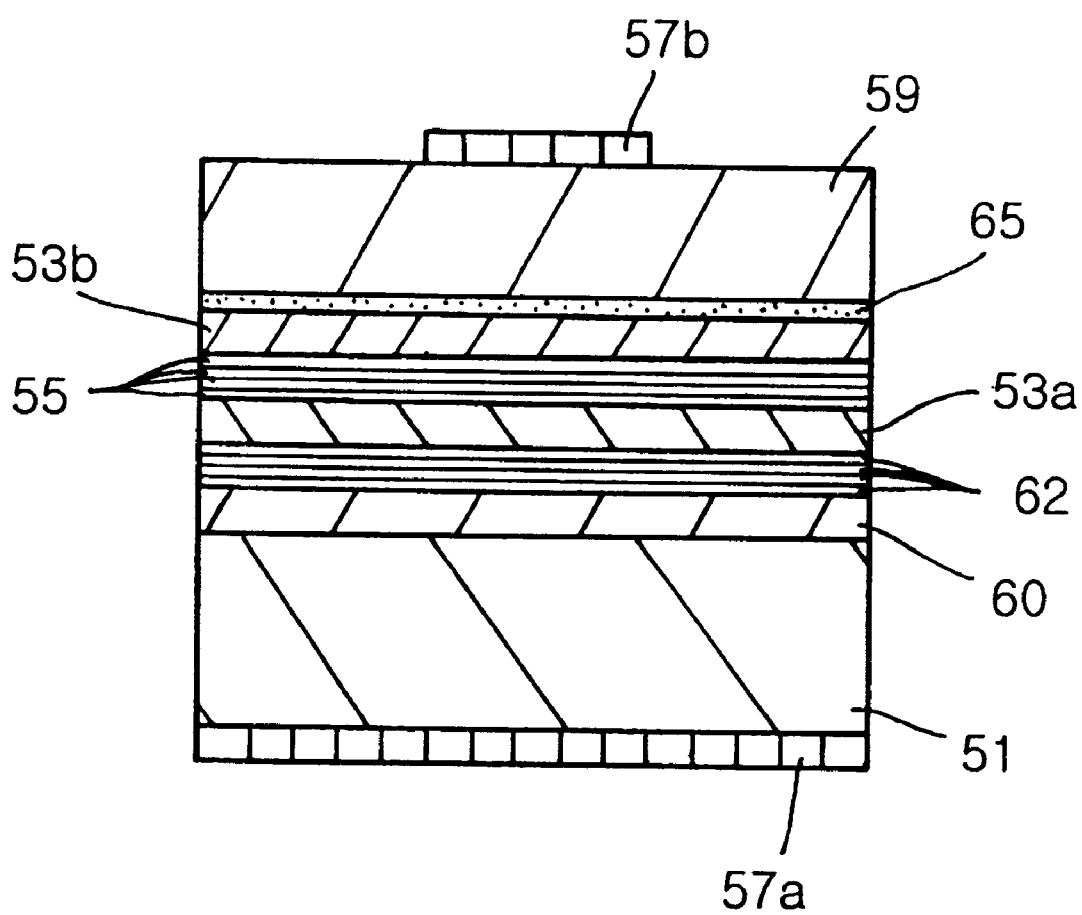
FIG. 3 is a view showing the structure of the light emitting diode of the present invention.

As shown in FIG. 3, on the n-GaAs semiconductor substrate 51, a buffer layer 60 made of the same material with the semiconductor substrate 51, i.e., n-GaAs is deposited. A plurality of distributed Bragg reflector(DBR) layers 62 including AlAs/GaAs are formed on the buffer layer 60 to minimize the optical absorption by the substrate and then improve the light emitting efficiency. A first confining layer 53a made of n-AlGaInP is disposed on the DBR layers 62 and an activation layer 55 made of $Al_xGa_{1-x}InP$ is formed thereon. On the activation layer 55, further, a second confining layer 53b made of p-AlGaInP is disposed.

In this light emitting diode, the thickness of the semiconductor substrate is approximately 250–350 µm. The buffer layer 60, the DBR layers 62, the first confining layer 53a, the activation layer, and the second confining layer 53b are continuously deposited with the metal organic chemical vapor deposition (MOCVD) process that the flow of the gas can be controlled precisely. Thus, the high purity layers may be formed and the thickness of the layers can be controlled. Further, the ratio of the component of the compound can be controlled. The buffer layer 60 is formed to stabilized the layers to be deposited after the MOCVD process. The n-AlGaInP first confining layer 53a and the p-AlGaInP second confining layer 53b are deposited in thickness of 0.5–1 µm. In this time, the n-type impurity is silicon and the p-type impurity is zinc or magnesium.

The $Al_xGa_{1-x}InP$ activation layer 55 comprises a plurality of layers. As x-value is varied in the process, multi-quantum well is formed in the activation layer 55. Therefore, many more electrons are occupied in the lower energy level of the multi-quantum well and as a result the electrons may easily be transited from the conduction band to the valence band so that the light emitting efficiency may be improved.

The first and second confining layers 53a, 53b and the activation layer 55 which are the practical activation layer in the LED are formed at the temperature of 800–830° C.

The intermediate layer 65 made of amorphous-like material is formed on the second confining layer 53b and the window layer 59 made of p-GaP is formed thereon. The intermediate layer 64 is deposited to prevent the lattice mismatch between the second confining layer 53b and the window layer 59. The intermediate layer 64 is continuously formed with the same MOCVD process after other layers are deposited. That is, the intermediate layer 65 is formed at the temperature 400–700° C. lower than the depositing temperature of other layers. In the MOCVD process, the abrupt falling of the temperature causes the decrease of the activation energy of the atoms during growing the p-GaP and thus the atoms are frozen. As a result, the p-GaP is grown in amorphous state. After the intermediate layer 65 is formed, the p-GaP window is continuously deposited with MOCVD process.

In practical, the intermediate layer 65 and the window layer 59 are formed with single process. After the second confining layer 53b is formed, the temperature is abruptly fallen at approximately 400–700° C. and the mixed gas is injected to form the window layer 59. Substantially, the intermediate layer 65 is continuously formed during the temperature is gradually rising. In other word, the intermediate layer 65 and the window layer 59 are formed with the same condition except the growing temperature.

The thickness of the window layer 59 is not fixed. In practical, it is preferable to form the window layer 59 thickly. As the thickness is increased, the current is easily dispersed into the edge portion of the LED chip in the material having certain resistance. Further, the total internal reflection effect is decreased inside the LED chip and the blocking effect by the electrode is also decreased. Preferably, the thickness of the intermediate layer 65 is approximately 0.01–0.5 µm, and the total thickness of the window layer and the intermediate layer 65 is approximately 5–15 µm.

Preferably, the window layer 59 is p-type GaAsP or p-type $Ga_xIn_{1-x}P$. Since the bandgap of the window layer 59 is larger than that of the AlGaInP activation layer 55, the light from the activation layer 55 is transmitted through the window layer 55. Further, since the difference of the lattice constant is small, the lattice mismatch phenomenon may be decreased. Thus, the current can be easily dispersed into the edge portion of the LED chip. At that time, x-value of the $Ga_xIn_{1-x}P$ is $0.7 \leq x \leq 1$. The window layer 59 and the intermediate layer 65 comprise the same material, i.e., GaAs or $Ga_xIn_{1-x}P$.

The intermediate layer 65 is not limited to the amorphous material. The intermediate layer 65 is disposed between the layers to remove the lattice mismatch phenomenon caused by the difference of the lattice constant of the layers, so that any material except the single crystalline material can be used as the intermediate layer if this material allows to decrease the lattice mismatch phenomenon between the single crystalline layers. For example, the material having poly-crystalline structure of which the grain boundary is small can be used as the intermediate layer. In the practical process, it is impossible to form the window layer 59 having the perfect single crystalline structure. The practical layer to be formed has poly-crystalline structure having large grain boundary. As used in this description and in the appended claims, the word 'single crystalline structure' means the structure including the single crystalline state and poly-crystalline state having the large grain boundary. Further, the word 'non-single crystalline structure' means amorphous-like state or the poly-crystalline state having small grain boundary. Since the light is scattered during transmitting through the poly-crystalline structure having the large grain boundary, the efficiency of the LED is seriously deteriorated. Thus, when growing at the low temperature, since the window layer 59 having the small grain boundary is grown, the light scattering may be prevented.

The first and second electrodes 57a,57b are respectively disposed on the semiconductor substrate 51 and the window layer 59. The first and second electrodes 57a,57b, the opaque electrodes, are formed by depositing the gold alloy having low resistance with the evaporation process or the sputtering process. The LED product is finally fabricated by cutting the deposited layers in a cube shape chip after depositing a plurality of layers on the semiconductor substrate 51.

In the above LED, when the current is applied from the first and second electrodes 57a,57b, the current is dispersed in the edge direction of the LED and flowing uniformly cross the p-n junction because of the high electric conductivity of the window layer 59. Thus, the light begins to emit from the total p-n junction. The intermediate layer 65 between the window layer 59 and the second confining layer 53b restrains the strain at the boundary and minimizes the boundary defect, so that the brightness and the Vf characteristics may be improved.

The table shows the brightness and Vf characteristics of the present LED having the intermediate layer 64 and the conventional LED.

TABLE

|  | brightness (mcd) | Vf (V) |
|---|---|---|
| Present LED | 65 | 1.88 |
| Convention LED | 35 | 2.35 |

As shown in Table, the present LED in which the window layer 59 includes the intermediate layer 65 has the brightness of 65 mcd, while the conventional LED has the 35 mcd. This means that the present LED has the improved brightness characteristic compared with the conventional LED. Further, the Vf is also improved.

While the invention has been described in its preferred embodiments, this should not be construed as limitation on the scope of the present invention. Accordingly, the scope of the present invention should be determined not by the embodiments illustrated, but by the appended claims and their legal equivalents.

What is claimed is:

1. A light emitting diode comprising:
a semiconductor substrate;
an activation p-n junction layer for emitting the light over the semiconductor substrate, the junction layer including AlGaInP;
a window layer over the junction layer, the window layer including material having the larger bandgap and the smaller resistance than the junction layer;
an intermediate layer including amorphous material, the intermediate layer being disposed between the junction layer and the window layer to decrease the defect at the boundary between the junction layer and the window layer by improving the boundary characteristic therebetween; and
first and second electrodes over the semiconductor substrate and the window layer.

2. The light emitting diode according to claim 1, further comprising:
a buffer layer between the semiconductor layer and the junction layer.

3. The light emitting diode according to claim 2, wherein the buffer layer includes n-GaAs.

4. The light emitting diode according to claim 2, further comprising:
a distributed bragg reflector layer between the buffer layer and the junction layer for reflecting the light emitted from the junction layer to the window layer.

5. The light emitting diode according to claim 4, wherein the distributed bragg reflector layer includes AlAs/GaAs.

6. The light emitting diode according to claim 1, wherein the p-n junction layer comprises:
a first confining layer including n-AlGaInP;
an activation layer including AlGaInP over the first confining layer; and
a second confining layer including p-AlGaInP over the activation layer.

7. The light emitting diode according to claim 6, wherein the activation layer comprises multi-quantum well having a plurality of layers, each layer of the multi-quantum well having different ratio of Al and Ga.

8. The light emitting diode according to claim 1, wherein the window layer includes the material selected from the group consisting of p-GaP, GaAsP, and $Ga_xIn_{1-x}P$.

9. The light emitting diode according to claim 8, wherein $0.7 \leq x \leq 1$.

10. The light emitting diode according to claim 1, wherein the thickness of the window layer is approximately 5–15 µm.

11. The light emitting diode according to claim 1, wherein the intermediate layer includes material selected from the group consisting of p-GaP, GaAsP, and $Ga_xIn_{1-x}P$.

12. The light emitting diode according to claim 8, wherein $0.7 \leq x \leq 1$.

13. The light emitting diode according to claim 1, wherein the thickness of the intermediate layer is approximately 0.01–0.5 µm.

14. A light emitting diode comprising:
a semiconductor substrate;
an activation p-n junction layer for emitting the light over the semiconductor substrate, the junction layer including AlGaInP;
a window layer over the junction layer, the window layer including material having the larger bandgap and the smaller resistance than the junction layer;
an intermediate layer including non-single crystalline material, the intermediate layer being disposed between the junction layer and the window layer to decrease the defect at the boundary between the junction layer and the window layer by improving the boundary characteristic therebetween; and
first and second electrodes over the semiconductor substrate and the window layer.

15. A light emitting diode, comprising:
a semiconductor substrate;
a first confining layer including n-AlGaInP over the semiconductor layer;
an activation layer including AlGaInP over the first confining layer;

a second confining layer including p-AlGaInP over the activation layer;

a window layer over the activation layer, the window layer including single crystalline material having larger bandgap and smaller resistance than the activation layer, the window layer having an intermediate layer made of non-single crystalline material for decreasing the defect at the boundary of the activation layer by improving the boundary characteristic; and first and second electrodes over the semiconductor substrate and the window layer.

16. The light emitting diode according to claim 15, further comprising:

a buffer layer between the semiconductor layer and the junction layer.

17. The light emitting diode according to claim 16, wherein the buffer layer includes n-GaAs.

18. The light emitting diode according to claim 16, further comprising:

a distributed bragg reflector layer between the buffer layer and the junction layer for reflecting the light emitted from the activation layer to the window layer.

19. The light emitting diode according to claim 18, wherein the distributed bragg reflector layer includes AlAs/GaAs.

20. The light emitting diode according to claim 15, wherein the activation layer comprises multi-quantum well having a plurality of layers, each layer of the multi-quantum well having different ratio of Al and Ga.

21. The light emitting diode according to claim 15, wherein the window layer includes the material selected from the group consisting of p-GaP, GaAsP, and $Ga_xIn_{1-x}P$.

22. The light emitting diode according to claim 15, wherein $0.7 \leq x \leq 1$.

23. The light emitting diode according to claim 15, wherein the thickness of the intermediate layer is approximately 0.01–0.5 μm.

* * * * *